United States Patent
Brask et al.

(10) Patent No.: US 6,806,146 B1
(45) Date of Patent: Oct. 19, 2004

(54) METHOD FOR MAKING A SEMICONDUCTOR DEVICE HAVING A HIGH-K GATE DIELECTRIC

(75) Inventors: Justin K. Brask, Portland, OR (US); Mark L. Doczy, Beaverton, OR (US); John P. Barnak, Portland, OR (US); Ying Zhou, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 10/441,616

(22) Filed: May 20, 2003

(51) Int. Cl.[7] .................................................. H01L 21/336
(52) U.S. Cl. ....................... 438/287; 438/216; 438/261; 438/585; 438/591; 438/785; 438/976
(58) Field of Search ................................ 438/197, 216, 438/240, 261, 287, 585, 591, 785, 976

(56) References Cited

U.S. PATENT DOCUMENTS

| | | | |
|---|---|---|---|
| 5,625,217 A | 4/1997 | Chau et al. ................ | 257/412 |
| 5,753,560 A | 5/1998 | Hong et al. ................ | 438/402 |
| 5,783,478 A | 7/1998 | Chau et al. ................ | 438/592 |
| 5,891,798 A | 4/1999 | Doyle et al. ............... | 438/624 |
| 6,063,698 A | 5/2000 | Tseng et al. ............... | 438/585 |
| 6,087,261 A | 7/2000 | Nishikawa et al. ........ | 438/685 |
| 6,121,094 A | 9/2000 | Gardner et al. ............ | 438/287 |
| 6,184,072 B1 | 2/2001 | Kaushik et al. | |
| 6,306,742 B1 | 10/2001 | Doyle et al. ............... | 438/591 |
| 6,391,802 B1 | 5/2002 | Delpech et al. ............ | 438/785 |
| 6,420,279 B1 | 7/2002 | Ono et al. | |
| 6,436,777 B1 | 8/2002 | Ota ............................ | 438/305 |
| 6,475,874 B2 | 11/2002 | Xiang et al. ............... | 438/396 |
| 6,514,828 B2 | 2/2003 | Ahn et al. .................. | 438/297 |
| 6,544,906 B2 | 4/2003 | Rotondaro et al. | |
| 6,617,209 B1 * | 9/2003 | Chau et al. ................. | 438/240 |
| 6,617,210 B1 | 9/2003 | Chau et al. ................. | 438/240 |
| 2002/0197790 A1 | 12/2002 | Kizilyalli et al. .......... | 438/240 |
| 2003/0032303 A1 | 2/2003 | Yu et al. | |
| 2003/0045080 A1 | 3/2003 | Visokay et al. ............ | 438/591 |

OTHER PUBLICATIONS

Doug Barlage et al., "High–Frequency Response of 100nm integrated CMOS Transistors with High–K Gate Dielectrics", 2001 IEEE, 4 pages.

Robert Chau et al., A 50nm Depleted–Substrate CMOS Transistor (DST), 2001 IEEE, 4 pages.

Lu et al., "Dual–Metal Gate Technology for Deep–Submicron CMOS Devices", dated Apr. 29, 2003, 1 page.

Schwantes et al., "Performance Improvement of Metal Gate CMOS Technologies with Gigabit Feature Sizes", Technical University of Hanburg–Harburg, 5 pages.

Chau et al., "A Method of Making Semiconductor Device Having a High–K Gate Dielectric", Ser. No. 10/082,530, Filed Feb. 22, 2002.

Parker et al., "A Method of Making Semiconductor Device Having a High–K Gate Dielectric", Ser. No. 10/285,915, Filed Oct. 31, 2002.

Chau et al., "A Method of Making Semiconductor Device Having a High–K Gate Dielectric", Ser. No. 10/288,043, Filed Nov. 5, 2002.

(List continued on next page.)

Primary Examiner—Jack Chen

(57) ABSTRACT

A method for making a semiconductor device is described. That method comprises forming on a substrate a high-k gate dielectric layer that includes impurities, then forming a silicon containing sacrificial layer on the high-k gate dielectric layer. After the silicon containing sacrificial layer has gettered the impurities from the high-k gate dielectric layer, the silicon containing sacrificial layer is removed, and a gate electrode is formed on the high-k gate dielectric layer. The method optionally includes exposing the high-k gate dielectric layer to a silicic acid containing solution until a silicon dioxide capping layer forms on the high-k gate dielectric layer, prior to forming a gate electrode on the capping layer.

4 Claims, 2 Drawing Sheets

OTHER PUBLICATIONS

Parker et al., "A Method of Making Semiconductor Device Having a High–K Gate Dielectric", Ser. No. 10/315,268, Filed Dec. 10, 2002.

Doczy et al., "A Method of Making Semiconductor Device Having a High–K Gate Dielectric", Ser. No. 10/338,174, Filed Jan. 7, 2003.

Brask et al., "A Method of Making Semiconductor Device Having a High–K Gate Dielectric", Ser. No. 10/387,303, Filed Mar. 11, 2003.

Brask et al., "A Method of Making Semiconductor Device Having a High–K Gate Dielectric", Ser. No. 10/391,816, Filed Mar. 18, 2003.

Chau et al., "A Method of Making a Semiconductor Device Having a Metal Gate Electrode", Ser. No. Unknown, Filed May 6, 2003.

Polishchuk et al., "Dual Workfunction CMOS Gate Technology Based on Metal Interdiffusion," 1 page.

* cited by examiner

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. Such a dielectric may not, however, be compatible with polysilicon—the preferred material for making the device's gate electrode.

When high-k films comprise an oxide formed using a metal halide precurser (e.g., a metal chloride), they may contain significant amounts of impurities (e.g., residual chlorine), which may adversely affect the electrical properties of a device that includes that film. In addition, an oxide based high-k film may manifest oxygen vacancies at random surface sites. When the device's gate electrode comprises polysilicon, a silicide may form where such vacancies occur. The silicide's presence may alter the electrode's workfunction or cause the device to short through the dielectric.

Accordingly, there is a need for an improved process for making a semiconductor device that includes a high-k gate dielectric. There is a need for such a process that removes a substantial amount of unwanted impurities from the high-k film prior to forming a polysilicon gate electrode on its surface. There is also a need for such a process that eliminates (or at least minimizes) silicide formation, when a polysilicon gate electrode is formed on the high-k film. The method of the present invention provides such a process.

DETAILED DESCRIPTION OF THE PRESENT INVENTION

Figure 1A:
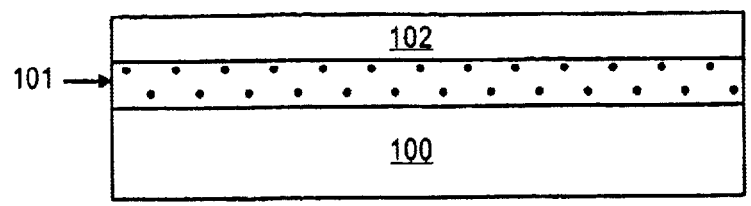
FIGS. 1a–1d represent cross-sections of structures that may be formed when carrying out an embodiment of the method of the present invention.

A method for making a semiconductor device is described. That method comprises forming on a substrate a high-k gate dielectric layer that includes impurities. A silicon containing sacrificial layer is then formed on the high-k gate dielectric layer. The silicon containing sacrificial layer is removed after the silicon containing sacrificial layer has gettered the impurities from the high-k gate dielectric layer. A gate electrode may then be formed on the high-k gate dielectric layer.

Optionally, the method of the present invention comprises exposing the high-k gate dielectric layer to a silicic acid containing solution until a silicon dioxide capping layer forms on the high-k gate dielectric layer, and then forming a gate electrode on the silicon dioxide capping layer. The method of the present invention contemplates processes that form and remove a silicon containing sacrificial layer, without further exposing the high-k gate dielectric layer to a silicic acid containing solution, and processes that expose the high-k gate dielectric layer to a silicic acid containing solution, without previously forming and removing a silicon containing sacrificial layer. These process sequences may be used independently. Alternatively, they may be integrated into a process that employs both process sequences—without departing from the spirit and scope of the present invention.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In an embodiment of the method of the present invention, high-k gate dielectric layer 101 is formed on substrate 100. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although several examples of materials from which substrate 100 may be formed are described here, any material that may serve as a foundation upon which a semiconductor device may be built falls within the spirit and scope of the present invention.

When substrate 100 comprises a silicon wafer, the wafer may be cleaned before forming high-k gate dielectric layer 101 on its surface. To clean the wafer, it may initially be exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCI solution. The water/$H_2O_2$/$NH_4OH$ solution may remove particles and organic contaminants, and the water/$H_2O^2$/HCI solution may remove metallic contaminants.

After that cleaning treatment, high-k gate dielectric layer 101 may be formed on substrate 100. High-k gate dielectric layer 101 comprises a material with a dielectric constant that is greater than the dielectric constant of silicon dioxide. Dielectric layer 101 preferably has a dielectric constant that is at least about twice that of silicon dioxide, i.e., a dielectric constant that is greater than about 8. Materials that may be used to make high-k gate dielectrics include: hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 101 are described here, that layer may be made from other materials that serve to reduce gate leakage.

High-k gate dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. In most applications, dielectric layer 101 should be less than about 60 angstroms thick, and more preferably between about 5 angstroms and about 40 angstroms thick.

Figure 1B:
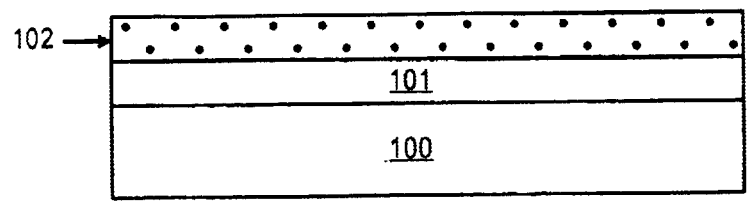
Figure 1C:
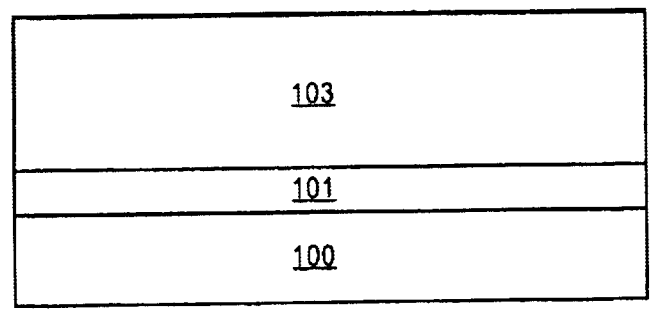

As deposited, high-k gate dielectric layer 101 will include undesirable impurities, e.g., residual chlorine (represented by dots in FIG. 1*a*), which render that layer incompatible with polysilicon. In this embodiment of the method of the present invention, impurities are removed from dielectric layer 101 to ensure compatibility with a gate electrode to be formed on it. FIGS. 1*a*–1*c* illustrate steps that may be applied to remove impurities from dielectric layer 101. First, silicon containing sacrificial layer 102 is formed on high-k gate dielectric layer 101 to generate the structure represented by FIG. 1*a*. Silicon containing sacrificial layer 102 may be formed on dielectric layer 101 using a conventional PVD process. In a preferred embodiment, a high purity silicon film is sputtered onto layer 101, using conventional equipment, materials, and operating conditions, to form silicon containing sacrificial layer 102. Preferably, such a process is used to form a high purity silicon film that is between about 10 angstroms and about 500 angstroms thick.

After silicon containing sacrificial layer 102 is formed on dielectric layer 101, impurities are gettered from high-k gate dielectric layer 101. It is believed that silicon containing sacrificial layer 102 may getter undesirable impurities (e.g., residual chlorine) from dielectric layer 101 by penetrating into the top monolayer of the high-k layer, enabling it to absorb those impurities from that high-k layer. It is further believed that silicon containing sacrificial layer 102 may getter impurities from high-k gate dielectric layer 101 without damaging underlying portions of that high-k layer.

FIG. 1*b* represents a structure in which undesirable impurities (e.g., residual chlorine or another halogen—represented by dots in FIG. 1*b*) have dissociated from high-k dielectric layer 101 and have been absorbed by silicon containing sacrificial layer 102. FIG. 1*b* is not meant to suggest that forming sacrificial layer 102 on dielectric layer 101 will cause all undesirable impurities, which are initially present in layer 101, to migrate into layer 102. Rather, sacrificial layer 102 is formed on layer 101 to cause a sufficient number of those impurities to move from high-k gate dielectric layer 101 into sacrificial layer 102 to ensure that high-k gate dielectric layer 101 will be compatible with a gate electrode to be formed on it. Thus, a method that forms a silicon containing sacrificial layer on a high-k gate dielectric layer, which does not remove from that dielectric layer all—or even substantially all—of the undesirable impurities that were initially present in that layer, may still fall within the spirit and scope of the present invention.

After silicon containing sacrificial layer 102 has gettered the undesirable impurities from dielectric layer 101, silicon containing sacrificial layer 102 is removed. In a preferred embodiment, silicon containing sacrificial layer 102 is removed from high-k gate dielectric layer 101 using a conventional wet etch process, which uses a chemistry that is selective for silicon over high-k gate dielectric layer 101. For example, silicon containing sacrificial layer 102 may be removed selectively from dielectric layer 101 by exposing that layer to a solution that contains ammonium hydroxide or tetramethyl ammonium hydroxide ("TMAH").

Figure 1D:
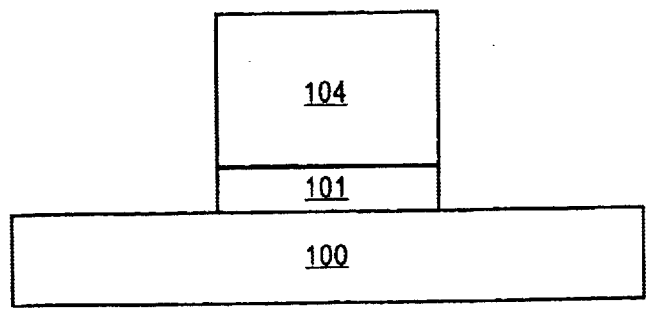

Following the removal of silicon containing sacrificial layer 102, a gate electrode may be formed directly on dielectric layer 101. In a preferred embodiment, the gate electrode may be formed by initially depositing polysilicon layer 103 on high-k gate dielectric layer 101—generating the FIG. 1*c* structure. Polysilicon layer 103 may be deposited using conventional methods and preferably is between about 500 angstroms and about 4,000 angstroms thick. After etching both layers 103 and 101 to form the FIG. 1*d* structure, using conventional techniques, additional steps that are generally used to complete the gate electrode (e.g., forming a silicide (not shown) on the upper part of etched polysilicon structure 104) may be applied. As such steps are well known to those skilled in the art, they will not be described in more detail here. Although the gate electrode preferably comprises polysilicon, in this embodiment of the present invention it may alternatively be formed from various metals with which the above described high-k gate dielectrics may be used.

As described above, forming a silicon containing sacrificial layer on the surface of a high-k gate dielectric layer, then removing it, may enable such a dielectric layer to be used with a polysilicon-based gate electrode. By removing such a sacrificial layer after it has gettered undesirable impurities from such a dielectric layer, the embodiment described above enables the resulting device to benefit from the temporary presence of the silicon containing sacrificial layer without experiencing any possible adverse effects that may result from permanently placing such a layer between the dielectric layer and the gate electrode. Although the embodiment described above is an example of a process that employs a silicon containing sacrificial layer to modify a high-k gate dielectric layer to promote compatibility with a gate electrode, the present invention is not limited to this particular embodiment. The present invention contemplates other processes that use such a sacrificial layer to modify such a dielectric layer to ensure compatibility between the dielectric layer and a gate electrode to be formed on it.

Figure 2A:
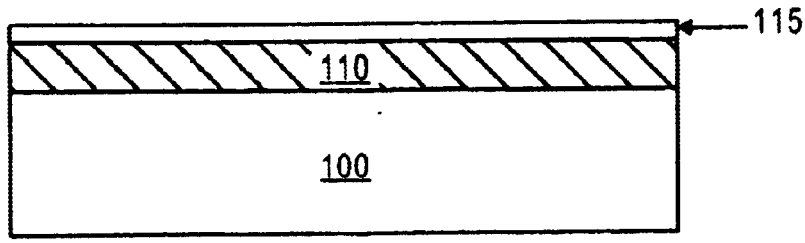
FIGS. 2a–2c represent cross-sections of structures that may be formed when carrying out a second embodiment of the method of the present invention. Features shown in these figures are not intended to be drawn to scale.
Figure 2B:
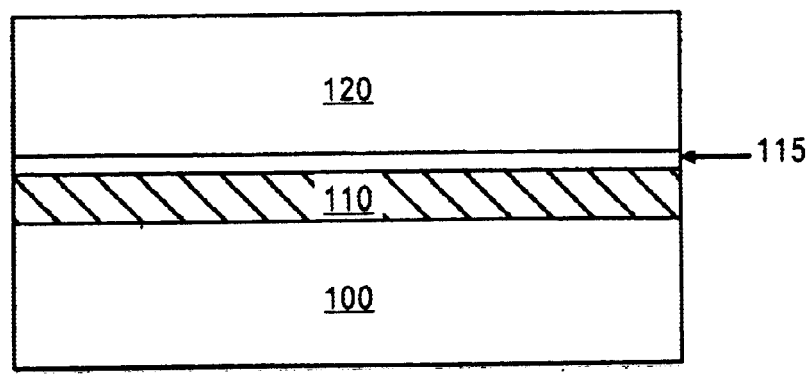
Figure 2C:
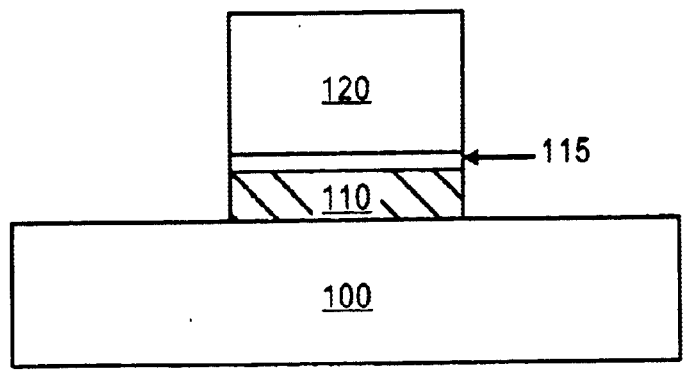

In the embodiment described above, gate electrode 104 is formed directly on high-k gate dielectric layer 101. Optionally, an ultra-thin silicon dioxide capping layer may be formed on dielectric layer 101 before forming the gate electrode on the silicon dioxide capping layer, as illustrated in FIGS. 2*a*–2*c*. In such a process, silicon dioxide capping layer 115 may be formed on high-k gate dielectric layer 110, as FIG. 2*a* illustrates. High-k gate dielectric layer 110 may have been cleaned using the process sequence described above prior to forming on its surface silicon dioxide capping layer 115.

Silicon dioxide capping layer 115 may be formed on high-k gate dielectric layer 110 by exposing dielectric layer 110 to a silicic acid ("$Si(OH)_4$") containing solution until silicon dioxide capping layer 115 forms on dielectric layer 110. In a preferred embodiment, such a $Si(OH)_4$ containing solution comprises an ammonium hydroxide based solution that is saturated with $Si(OH)_4$. Such a $Si(OH)_4$ containing solution may be formed by dissolving silicon in an ammonium hydroxide based solution that has a pH of at least about 9.5, and more preferably a pH that is between about 9.5 and about 13. Dielectric layer 110 preferably is exposed to the $Si(OH)_4$ containing solution until a silicon dioxide capping layer that is less than about five monolayers thick forms on dielectric layer 110. More preferably, silicon dioxide capping layer 115 consists of only one or two monolayers.

These optional process steps may be particularly desirable, if high-k gate dielectric layer 110 manifests a substantial number of oxygen vacancies (i.e., surface sites where hydroxyl group termination has been depleted). Where such vacancies occur, a silicide may form. When silicon dioxide capping layer 115 is formed on high-k gate dielectric layer 110 by exposing dielectric layer 110 to a Si(OH)$_4$ containing solution, those surface sites may be saturated. In addition, capping layer 115 may serve as an ultra-thin protective oxide layer that prevents silicide formation, when polysilicon layer 120 is formed on silicon dioxide capping layer 115, as shown in FIG. 2b. After layers 120, 115 and 110 are etched (using conventional techniques) to form the FIG. 2c structure, conventional process steps may be used to complete the device.

These optional process steps may further facilitate use of a high-k gate dielectric with a polysilicon based gate electrode. By forming an ultra-thin silicon dioxide capping layer on a high-k gate dielectric layer, silicide formation may be substantially reduced, helping to enhance the resulting device's electrical properties. As mentioned above, the process sequences that FIGS. 1a–1d and FIGS. 2a–2c illustrate, respectively, may be applied independently or, alternatively, integrated into a process that employs both process sequences.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

forming a high-k gate dielectric layer on a substrate, the high-k gate dielectric layer including impurities, being less than about 60 angstroms thick, and comprising a material selected from the group consisting of hafnium oxide, zirconium oxide, titanium oxide, and aluminum oxide;

forming a silicon containing sacrificial layer on the high-k gate dielectric layer;

removing the silicon containing sacrificial layer after the silicon containing sacrificial layer has gettered the impurities from the high-k gate dielectric layer;

exposing the high-k gate dielectric layer to a silicic acid containing solution until a silicon dioxide capping layer forms on the high-k gate dielectric layer;

forming a layer that comprises polysilicon on the silicon dioxide capping layer; and etching the polysilicon containing layer, the silicon dioxide capping layer and the high-h gate dielectric layer.

2. The method of claim 1 wherein the high-k gate dielectric layer is formed by atomic layer chemical vapor deposition and is between about 5 angstroms and about 40 angstroms thick.

3. The method of claim 1 wherein the silicon containing sacrificial layer is between about 10 angstroms and about 500 angstroms thick and is removed by exposing it to a solution that contains ammonium hydroxide or tetramethyl ammonium hydroxide.

4. The method of claim 1 wherein the sllicic acid containing solution is formed by dissolving silicon in an ammonium hydroxide based solution that has a pH of at least about 9.5.

* * * * *